United States Patent
Liu et al.

(10) Patent No.: US 10,771,233 B1
(45) Date of Patent: Sep. 8, 2020

(54) CLOCK DATA RECOVERY CIRCUIT

(71) Applicant: Realtek Semiconductor Corp., Hsinchu (TW)

(72) Inventors: Yao-Chia Liu, Chiayi (TW); Chi-Wei Yen, Hsinchu County (TW); Wei-Zen Chen, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/793,267

(22) Filed: Feb. 18, 2020

(30) Foreign Application Priority Data

Feb. 19, 2019 (TW) .............................. 108105499 A

(51) Int. Cl.
H04L 7/04 (2006.01)
H03L 7/08 (2006.01)
H03L 7/087 (2006.01)
H04L 7/00 (2006.01)
H03L 7/18 (2006.01)
H03L 7/081 (2006.01)
H03L 7/099 (2006.01)

(52) U.S. Cl.
CPC ................ H04L 7/04 (2013.01); H03L 7/081 (2013.01); H03L 7/0807 (2013.01); H03L 7/087 (2013.01); H03L 7/099 (2013.01); H03L 7/18 (2013.01); H04L 7/0025 (2013.01)

(58) Field of Classification Search
CPC . H04L 17/0331; H04L 17/033; H03L 7/0807; H03L 7/087; H03L 7/099
See application file for complete search history.

(56) References Cited

U.S. PATENT DOCUMENTS 7,089,444 B1 * 8/2006 Asaduzzaman ......... H04L 7/033
375/376
2002/0075980 A1 * 6/2002 Tang ....................... H03L 7/081
375/372
(Continued)

FOREIGN PATENT DOCUMENTS

TW    I338456 B    3/2011

OTHER PUBLICATIONS

Office Action issued in Taiwanese Patent Application No. 108105499, dated Jun. 28, 2019.

Primary Examiner — Kevin Kim
(74) Attorney, Agent, or Firm — Birch, Stewart, Kolasch & Birch, LLP

(57) ABSTRACT

A clock data recovery circuit includes: a first detecting circuit for detecting phases of an incoming data signal and a sampling clock signal to generate a first detection signal; a loop filter for generating a control signal according to the first detection signal; a second detecting circuit for detecting phases of a reference signal and a feedback signal to generate a second detection signal; a control voltage generating circuit for generating a control voltage based on the second detection signal; a voltage-controlled oscillator for generating the sampling clock signal according to the control voltage; a phase adjustment circuit for adjusting the phase of the sampling clock signal according to the control signal to generate the phase-adjusted signal; and a frequency divider circuit for conducting a frequency division operation on the phase-adjusted signal to generate the feedback signal.

8 Claims, 4 Drawing Sheets

(56) References Cited

U.S. PATENT DOCUMENTS

| | | | |
|---|---|---|---|
| 2008/0101521 A1* | 5/2008 | Lee | H03L 7/0995 |
| | | | 375/371 |
| 2009/0122939 A1* | 5/2009 | Hoang | H03K 19/17732 |
| | | | 375/375 |
| 2012/0063558 A1* | 3/2012 | Reijonen | H01J 35/04 |
| | | | 376/108 |

* cited by examiner

CLOCK DATA RECOVERY CIRCUIT

CROSS-REFERENCE TO RELATED APPLICATIONS

This application claims the benefit of priority to Patent Application No. 108105499, filed in Taiwan on Feb. 19, 2019; the entirety of which is incorporated herein by reference for all purposes.

BACKGROUND

The disclosure generally relates to a clock data recovery circuit and, more particularly, to a clock data recovery circuit capable of accelerating the loop response speed and does not easily result in frequency drift.

A clock data recovery circuit is widely employed in many applications, but the conventional clock data recovery circuit typically uses the analog loop filter. Therefore, in the situation of that the input terminal of the clock data recovery circuit does not receive any data signal over a certain period of time, it easily causes frequency drift in the resulting sampling clock signal.

The frequency drift problem may be reduced by replacing the analog loop filter with more complex digital loop filter, but it would easily result in insufficient loop response speed, thereby causing the conventional clock data recovery circuit to be unable to support applications having higher data signal frequency.

SUMMARY

An example embodiment of a clock data recovery circuit is disclosed, comprising: a first detecting circuit, arranged to operably detect phases of a data signal and a sampling clock signal to generate a corresponding first detection signal; a first loop filter, coupled with the first detecting circuit, and arranged to operably process the first detection signal to generate a control signal; a second detecting circuit, arranged to operably detect phases of a reference signal and a feedback signal to generate a corresponding second detection signal; a control voltage generating circuit, coupled with the second detecting circuit, and arranged to operably generate a corresponding control voltage according to the second detection signal; a voltage-controlled oscillator, coupled with the control voltage generating circuit, and arranged to operably generate the sampling clock signal according to the control voltage; a phase adjustment circuit, coupled with the first loop filter and the voltage-controlled oscillator, and arranged to operably adjust a phase of the sampling clock signal according to the control signal, so as to generate a phase-adjusted signal; and a frequency divider circuit, coupled with the second detecting circuit and the phase adjustment circuit, and arranged to operably conduct a frequency division operation on the phase-adjusted signal to generate the feedback signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
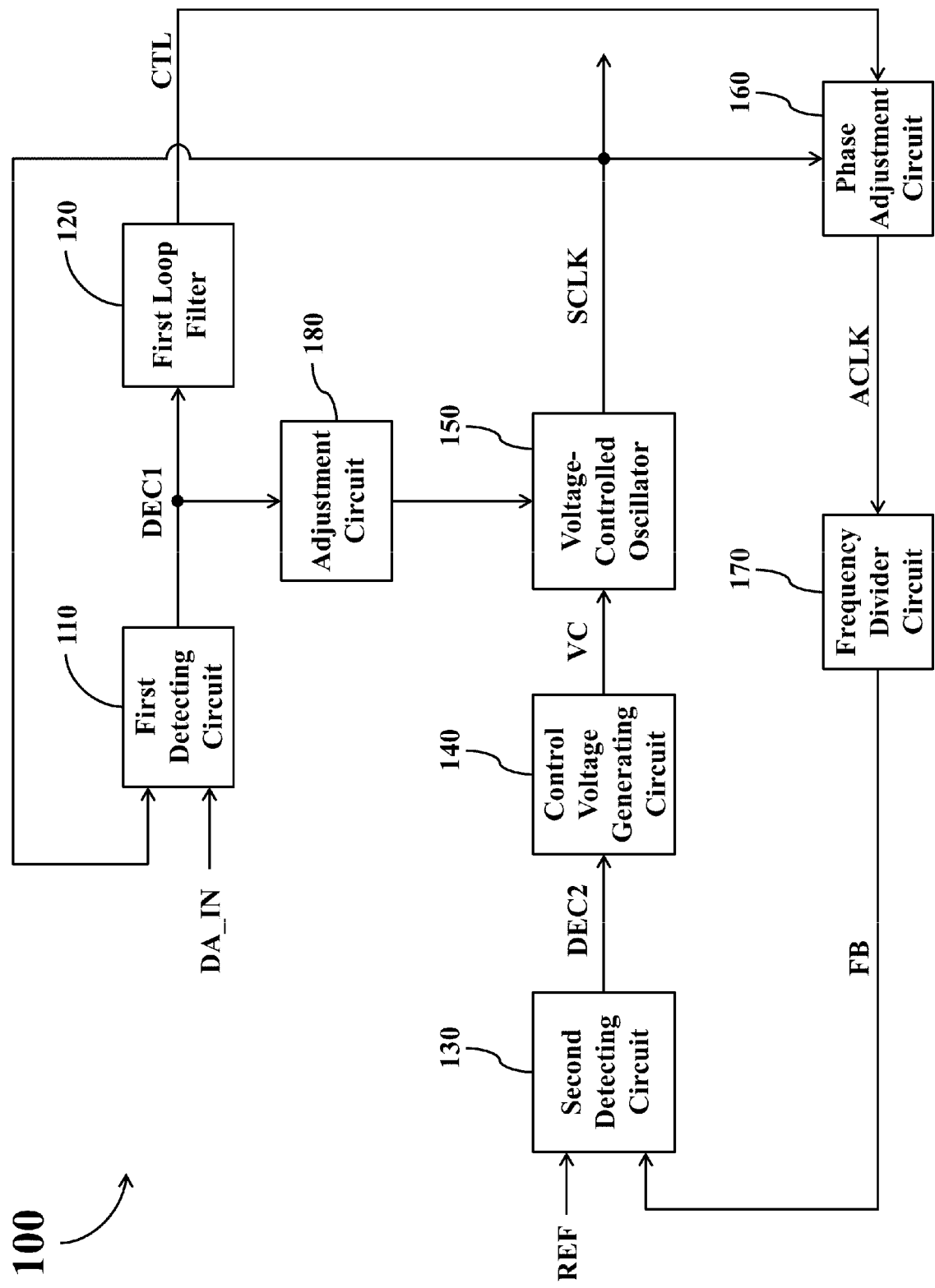
FIG. 1 shows a simplified functional block diagram of a clock data recovery circuit according to one embodiment of the present disclosure.

FIG. 1 shows a simplified functional block diagram of a clock data recovery circuit 100 according to one embodiment of the present disclosure. The clock data recovery circuit 100 is utilized to receive a data signal DA_IN and to generate a sampling clock signal SCLK, which can be utilized to sample the data signal DA_IN, according to the data signal DA_IN. As shown in FIG. 1, the clock data recovery circuit 100 comprises a first detecting circuit 110, a first loop filter 120, a second detecting circuit 130, a control voltage generating circuit 140, a voltage-controlled oscillator 150, a phase adjustment circuit 160, a frequency divider circuit 170, and an adjustment circuit 180.

The first detecting circuit 110 is arranged to operably detect phases of the data signal DA_IN and the sampling clock signal SCLK to generate a corresponding first detection signal DEC1. The first detecting circuit 110 may be realized with various suitable phase detector circuits, frequency detector circuits, or phase and frequency detector circuits. The first detection signal DEC1 may be realized with any signal formats capable of representing the relative timing relationship between the phase of the data signal DA_IN and the phase of the sampling clock signal SCLK.

The first loop filter 120 is coupled with the first detecting circuit 110, and arranged to operably process the first detection signal DEC1 to generate a control signal CTL. The first loop filter 120 may be realized with various suitable digital filters, so as to increase the related loop response speed.

The second detecting circuit 130 is arranged to operably detect phases of a reference signal REF and a feedback signal FB to generate a corresponding second detection signal DEC2. The aforementioned reference signal REF is designed to have a frequency similar to or identical to the frequency of the data signal DA_IN received by the clock data recovery circuit 100. In practice, the reference signal REF may be generated by other suitable circuits (not shown in FIG. 1) located outside the clock data recovery circuit 100. The second detecting circuit 130 may be realized with various suitable phase detector circuits, frequency detector circuits, or phase and frequency detector circuits. The second detection signal DEC2 may be realized with any signal format capable of representing the relative timing relationship between the phase of the reference signal REF and the phase of the feedback signal FB.

The control voltage generating circuit 140 is coupled with the second detecting circuit 130, and arranged to operably generate a corresponding control voltage VC according to the second detection signal DEC2. In this embodiment, when the second detection signal DEC2 indicates that the phase of the reference signal REF is ahead the phase of the feedback signal FB, the control voltage generating circuit 140 may increase the magnitude of the control voltage VC. On the contrary, when the second detection signal DEC2 indicates that the phase of the reference signal REF is behind the phase of the feedback signal FB, the control voltage generating circuit 140 may decrease the magnitude of the control voltage VC.

The voltage-controlled oscillator 150 is coupled with the control voltage generating circuit 140, and arranged to operably generate the aforementioned sampling clock signal SCLK according to the control voltage VC. The voltage-controlled oscillator 150 may increase the frequency of the outputted sampling clock signal SCLK when the control voltage generating circuit 140 increases the magnitude of the control voltage VC; and may decrease the frequency of the sampling clock signal SCLK when the control voltage generating circuit 140 decreases the magnitude of the control voltage VC.

The phase adjustment circuit 160 is coupled with the first loop filter 120 and the voltage-controlled oscillator 150, and arranged to operably adjust the phase of the sampling clock signal SCLK according to the control signal CTL to generate a phase-adjusted signal ACLK. In practice, the phase adjustment circuit 160 may be realized with various phase interpolation circuits, programmable delay chains, or other suitable circuits.

The frequency divider circuit 170 is coupled with the second detecting circuit 130 and the phase adjustment circuit 160, and arranged to operably conduct a frequency division operation on the phase-adjusted signal ACLK to generate the aforementioned feedback signal FB, so that the frequency of the feedback signal FB is lower than the frequency of the phase-adjusted signal ACLK. In practice, the frequency divider circuit 170 may be realized with various suitable integer frequency dividers or fractional frequency dividers.

The adjustment circuit 180 is coupled with the first detecting circuit 110 and the voltage-controlled oscillator 150, and arranged to operably control the voltage-controlled oscillator 150 according to the first detection signal DEC1 to change the phase of the sampling clock signal SCLK. In other words, the aforementioned voltage-controlled oscillator 150 not only adjusts the frequency of the sampling clock signal SCLK according to the control voltage VC generated by the control voltage generating circuit 140, but also adjusts the phase of the sampling clock signal SCLK under control of the adjustment circuit 180.

During the operation of the clock data recovery circuit 100, the aforementioned first detecting circuit 110, adjustment circuit 180, and voltage-controlled oscillator 150 collectively form a first loop. The second detecting circuit 130, the control voltage generating circuit 140, the voltage-controlled oscillator 150, the phase adjustment circuit 160, and the frequency divider circuit 170 collectively form a second loop.

Since the aforementioned phase adjustment circuit 160 adjusts the phase of the sampling clock signal SCLK under control of the first loop filter 120 to generate the phase-adjusted signal ACLK, the aforementioned first loop and second loop are enabled to reach respective steady states at the same time. As a result, the first loop and the second loop can operate simultaneously. That is, the first loop and the second loop in the clock data recovery circuit 100 can share the sampling clock signal SCLK generated by the voltage-controlled oscillator 150 at the same time.

Therefore, there is no need to arrange additional switch circuits in the clock data recovery circuit 100 to switch the voltage-controlled oscillator 150 between the aforementioned first loop and second loop. As a result, the probability of that frequency drift occurs in the sampling clock signal SCLK outputted from the voltage-controlled oscillator 150 can be effectively reduced.

Figure 2:
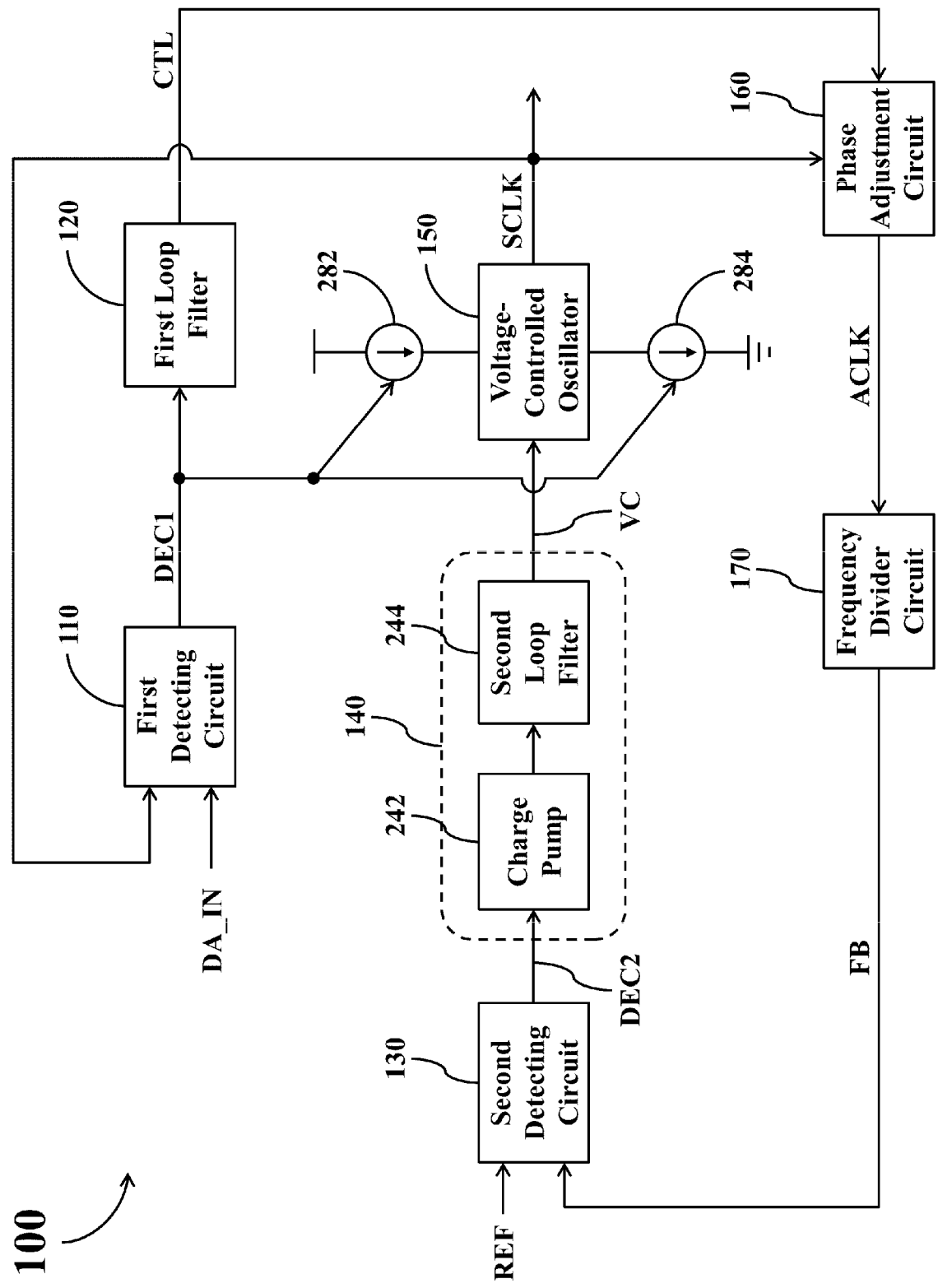
FIGS. 2-4 show simplified schematic diagrams of an adjustment circuit in the clock data recovery circuit according to different embodiments of the present disclosure.

In practice, the control voltage generating circuit 140 may be realized with a cooperation of a charge pump and a loop filter. In the embodiment of FIG. 2, for example, the control voltage generating circuit 140 comprises a charge pump 242 and a second loop filter 244.

The charge pump 242 is coupled with the second detecting circuit 130, and arranged to operably generate a corresponding output voltage according to the second detection signal DEC2. The second loop filter 244 is coupled with the charge pump 242 and the voltage-controlled oscillator 150, and arranged to operably compensate and filter the output voltage of the charge pump 242, so as to generate the aforementioned control voltage VC. In practice, the aforementioned charge pump 242 and second loop filter 244 may be realized with various suitable circuit structures.

In this embodiment, when the second detecting circuit 130 has detected that the phase of the reference signal REF is ahead the phase of the feedback signal FB, the second detecting circuit 130 may utilize the second detection signal DEC2 to control the charge pump 242 to increase the output voltage, to thereby increase the control voltage VC. When the second detecting circuit 130 has detected that the phase of the reference signal REF is behind the phase of the feedback signal FB, the second detecting circuit 130 may utilize the second detection signal DEC2 to control the charge pump 242 to decrease the output voltage, to thereby decrease the control voltage VC.

In the embodiment of FIG. 2, the aforementioned adjustment circuit 180 may be realized with a combination of a current source circuit 282 and a current sink circuit 284. The current source circuit 282 is arranged to operably increase the current passing through the voltage-controlled oscillator 150 according to the first detection signal DEC1. The current sink circuit 284 is arranged to operably decrease the current passing through the voltage-controlled oscillator 150 according to the first detection signal DEC1.

When the first detecting circuit 110 has detected that the phase of the data signal DA_IN is ahead the phase of the sampling clock signal SCLK, the first detecting circuit 110 may utilize the first detection signal DEC1 to control the adjustment circuit 180 to increase the current passing through the voltage-controlled oscillator 150, so that the voltage-controlled oscillator 150 would advance the phase of the sampling clock signal SCLK. On the other hand, when the first detecting circuit 110 has detected that the phase of the data signal DA_IN is behind the phase of the sampling clock signal SCLK, the first detecting circuit 110 may utilize the first detection signal DEC1 to control the adjustment circuit 180 to decrease the current passing through the voltage-controlled oscillator 150, so that the voltage-controlled oscillator 150 would delay the phase of the sampling clock signal SCLK.

By utilizing the adjustment circuit 180 to directly adjust the current passing through the voltage-controlled oscillator 150 according to the detecting result of the first detecting circuit 110, the phase of the sampling clock signal SCLK outputted from the voltage-controlled oscillator 150 can be changed, thereby significantly increasing the loop response speed of the aforementioned first loop. Even if the clock data recovery circuit 100 does not receive the data signal DA_IN for a longer period of time, because the second detecting circuit 130 still works for every reference period and keep adjusting the voltage-controlled oscillator 150, the frequency of the sampling clock signal SCLK outputted from the voltage-controlled oscillator 150 can still remain stable. In this way, it effectively reduces the possibility of that the frequency drift occurs in the sampling clock signal SCLK outputted from the voltage-controlled oscillator 150.

Figure 3:
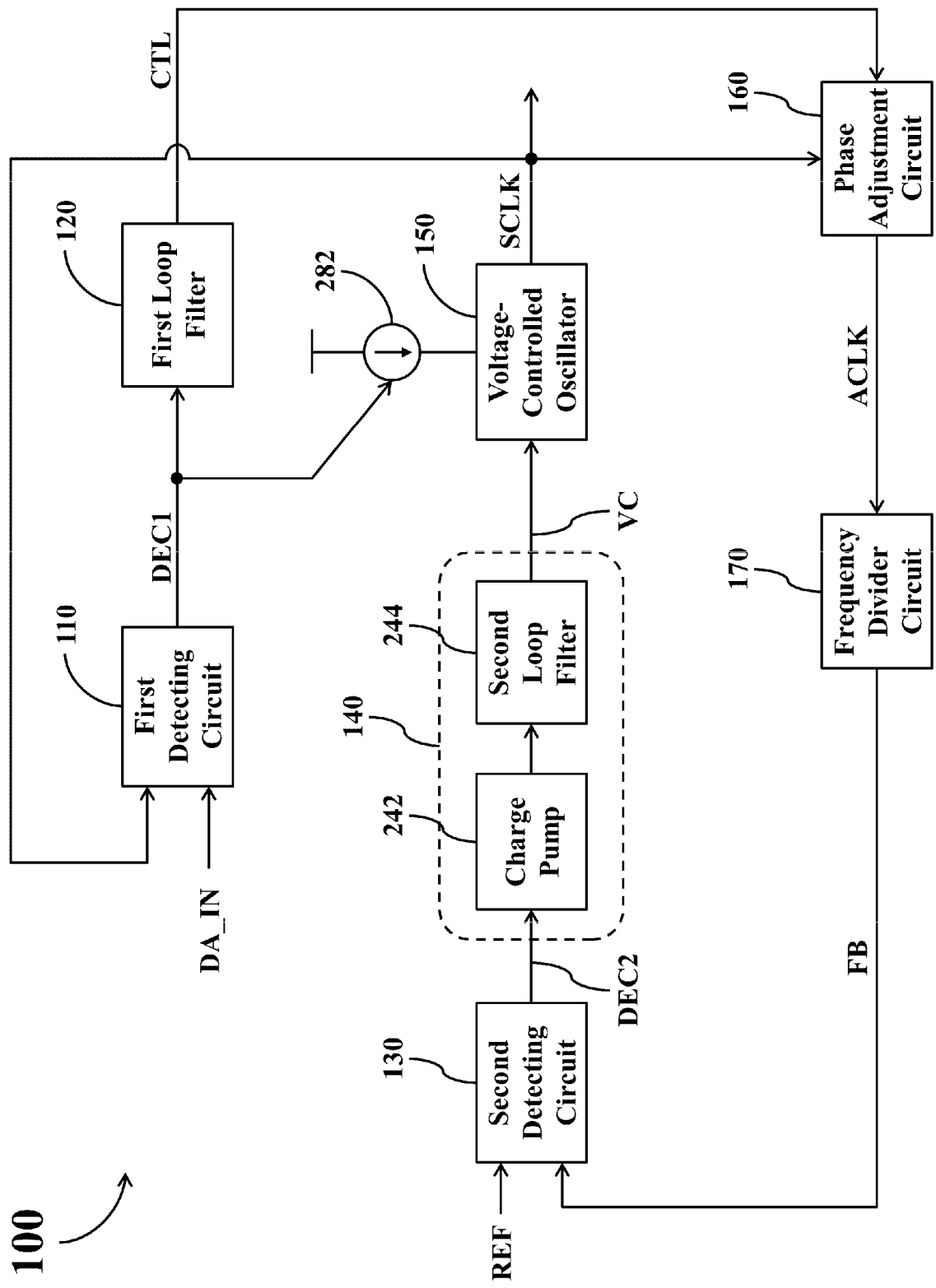

Please note that the aforementioned circuit structures are merely exemplary embodiments rather than a restriction to the practical implementations. As shown in FIG. 3, the current sink circuit 284 in the aforementioned adjustment circuit 180 may be omitted in some embodiments.

Figure 4:
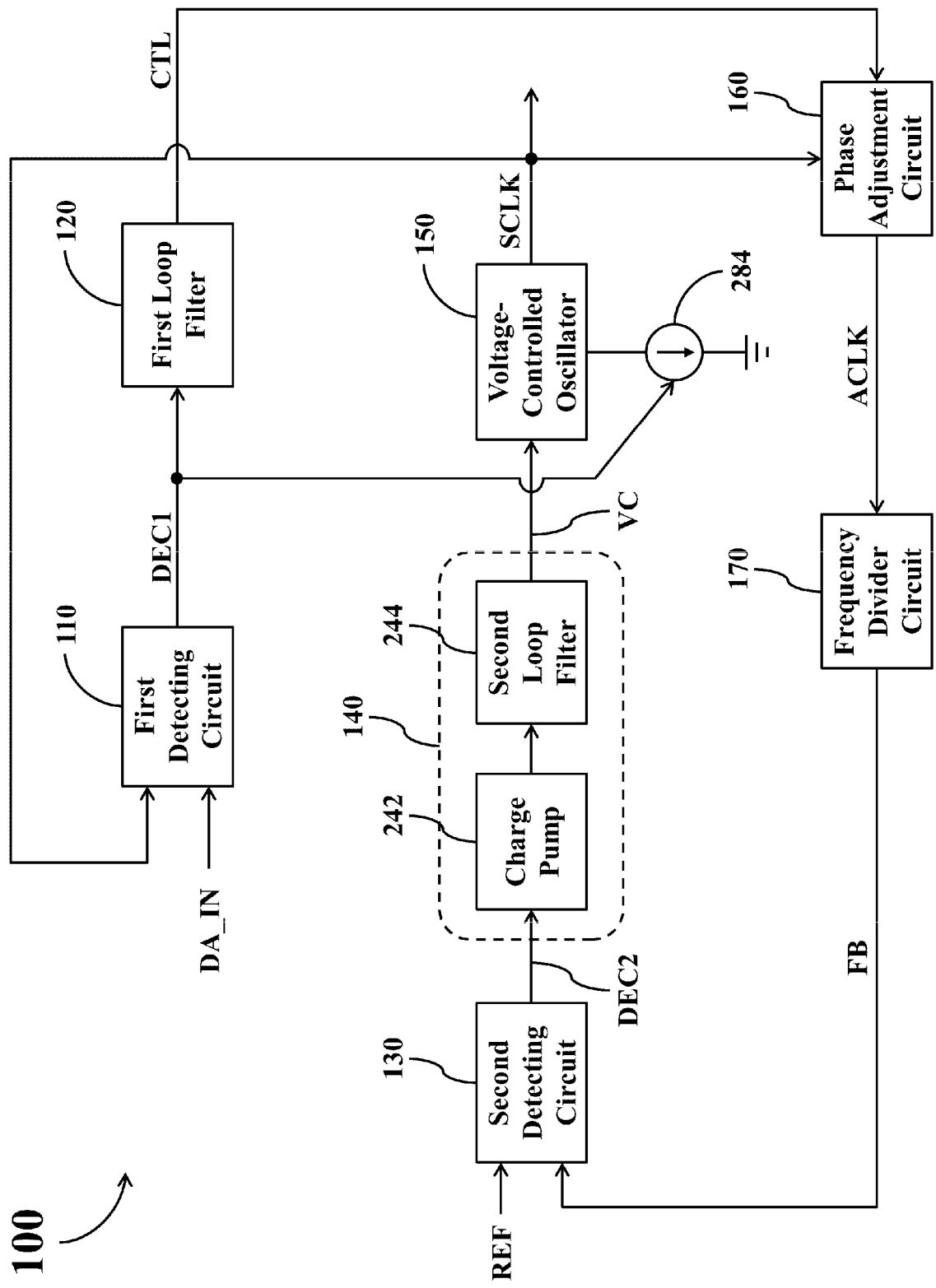

As shown in FIG. 4, for another example, the current source circuit 282 in the adjustment circuit 180 may be omitted in some embodiments.

In some embodiments, the aforementioned adjustment circuit 180 may be instead realized with a variable capacitor circuit coupled with the input terminal of the voltage-controlled oscillator 150. In this embodiment, the first detecting circuit 110 may utilize the first detection signal DEC1 to change the capacitance of the adjustment circuit 180, so as to change the input voltage of the voltage-controlled oscillator 150, thereby adjusting the phase of the sampling clock signal SCLK.

In another embodiment, the adjustment circuit 180 may be instead realized with various voltage adjustment circuits capable of changing the input voltage of the voltage-controlled oscillator 150 according to the first detection signal DEC1.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A clock data recovery circuit (100), comprising:
   a first detecting circuit (110), arranged to operably detect phases of a data signal (DA_IN) and a sampling clock signal (SCLK) to generate a corresponding first detection signal (DEC1);
   a first loop filter (120), coupled with the first detecting circuit (110), and arranged to operably process the first detection signal (DEC1) to generate a control signal (CTL);
   a second detecting circuit (130), arranged to operably detect phases of a reference signal (REF) and a feedback signal (FB) to generate a corresponding second detection signal (DEC2);
   a control voltage generating circuit (140), coupled with the second detecting circuit (130), and arranged to operably generate a corresponding control voltage (VC) according to the second detection signal (DEC2);
   a voltage-controlled oscillator (150), coupled with the control voltage generating circuit (140), and arranged to operably generate the sampling clock signal (SCLK) according to the control voltage (VC);
   a phase adjustment circuit (160), coupled with the first loop filter (120) and the voltage-controlled oscillator (150), and arranged to operably adjust a phase of the sampling clock signal (SCLK) according to the control signal (CTL), so as to generate a phase-adjusted signal (ACLK); and
   a frequency divider circuit (170), coupled with the second detecting circuit (130) and the phase adjustment circuit (160), and arranged to operably conduct a frequency division operation on the phase-adjusted signal (ACLK) to generate the feedback signal (FB).

2. The clock data recovery circuit (100) of claim 1, further comprising:
   an adjustment circuit (180), coupled with the first detecting circuit (110) and the voltage-controlled oscillator (150), and arranged to operably control the voltage-controlled oscillator (150) according to the first detection signal (DEC1) to change the phase of the sampling clock signal (SCLK).

3. The clock data recovery circuit (100) of claim 2, wherein the adjustment circuit (180) is arranged to operably adjust a current passing through the voltage-controlled oscillator (150) according to the first detection signal (DEC1) to thereby change the phase of the sampling clock signal (SCLK).

4. The clock data recovery circuit (100) of claim 2, wherein the control voltage generating circuit (140) comprises:
   a charge pump (242), coupled with the second detecting circuit (130), and arranged to operably generate a corresponding output voltage according to the second detection signal (DEC2); and
   a second loop filter (244), coupled with the charge pump (242) and the voltage-controlled oscillator (150), and arranged to operably compensate and filter the output voltage, so as to generate the control voltage (VC).

5. The clock data recovery circuit (100) of claim 2, wherein the adjustment circuit (180) comprises:
   a current source circuit (282), arranged to operably increase the current passing through the voltage-controlled oscillator (150) according to the first detection signal (DEC1).

6. The clock data recovery circuit (100) of claim 2, wherein the adjustment circuit (180) comprises:
   a current sink circuit (284), arranged to operably decrease the current passing through the voltage-controlled oscillator (150) according to the first detection signal (DEC1).

7. The clock data recovery circuit (100) of claim 2, wherein the adjustment circuit (180) comprises:
   a current source circuit (282), arranged to operably increase the current passing through the voltage-controlled oscillator (150) according to the first detection signal (DEC1); and a current sink circuit (284), arranged to operably decrease the current passing through the voltage-controlled oscillator (150) according to the first detection signal (DEC1).

8. The clock data recovery circuit (100) of claim 2, wherein when the clock data recovery circuit (100) operates, the first detecting circuit (110), the adjustment circuit (180), and the voltage-controlled oscillator (150) form a first loop, while the second detecting circuit (130), the control voltage generating circuit (140), the voltage-controlled oscillator (150), the phase adjustment circuit (160), and the frequency divider circuit (170) form a second loop, and the first loop and the second loop both share the sampling clock signal (SCLK) generated by the voltage-controlled oscillator (150) at the same time.

* * * * *